United States Patent [19]

Lin et al.

[11] Patent Number: 5,098,796
[45] Date of Patent: * Mar. 24, 1992

[54] CHROMIUM-ZINC ANTI-TARNISH COATING ON COPPER FOIL

[75] Inventors: Lifun Lin; Chung-Yao Chao, both of Waltham, Mass.

[73] Assignee: Olin Corporation, New Haven, Conn.

[*] Notice: The portion of the term of this patent subsequent to Jun. 11, 2008 has been disclaimed.

[21] Appl. No.: 673,923

[22] Filed: Mar. 25, 1991

Related U.S. Application Data

[60] Division of Ser. No. 585,832, Sep. 20, 1990, Pat. No. 5,022,968, which is a continuation-in-part of Ser. No. 459,846, Jan. 2, 1990, abandoned, which is a continuation-in-part of Ser. No. 421,475, Oct. 13, 1989, abandoned.

[51] Int. Cl.$^5$ .............................. B32B 15/20
[52] U.S. Cl. ................... 428/607; 428/658; 428/674; 428/935
[58] Field of Search ............... 204/44.2; 428/658, 607, 428/674, 666, 935

[56] References Cited

U.S. PATENT DOCUMENTS

| | | | |
|---|---|---|---|
| 2,080,891 | 2/1935 | McDonald et al. | 384/483 |
| 2,412,543 | 12/1946 | Tanner | 428/628 |
| 2,418,608 | 5/1947 | Thompson et al. | 428/472.1 |
| 2,647,865 | 8/1953 | Freud et al. | 204/33 |
| 3,106,484 | 1/1961 | Miller | 428/658 |
| 3,323,881 | 11/1963 | Nelson et al. | 428/658 |
| 3,585,010 | 6/1971 | Luce et al. | 428/608 |
| 3,625,844 | 12/1971 | McKean | 204/140 |
| 3,677,828 | 7/1972 | Caule | 148/253 |
| 3,716,427 | 2/1973 | Caule | 156/630 |
| 3,764,400 | 9/1973 | Caule | 148/258 |
| 3,816,142 | 6/1974 | Lindemann | 428/658 |
| 3,853,716 | 12/1974 | Yates et al. | 204/28 |
| 3,857,681 | 12/1974 | Yates et al. | 428/554 |
| 3,857,683 | 12/1974 | Castonguay | 428/608 |
| 4,043,381 | 9/1977 | Adaniya et al. | 204/44.2 |
| 4,048,381 | 9/1977 | Adaniya et al. | 428/632 |
| 4,049,481 | 11/1977 | Morisaki | 156/151 |
| 4,064,320 | 12/1977 | Adaniya et al. | 204/44.2 |
| 4,131,517 | 12/1978 | Mitumo et al. | 204/27 |
| 4,376,154 | 3/1983 | Nakatsugawa | 428/658 |
| 4,386,139 | 5/1983 | Nakatsugawa | 204/44.2 |
| 4,387,006 | 6/1983 | Kajiwara et al. | 204/32 R |
| 4,407,900 | 10/1983 | Kirihara et al. | 204/44.2 |
| 4,432,846 | 2/1984 | Honeycutt, III | 204/129.95 |
| 4,456,508 | 6/1984 | Torday et al. | 204/27 |
| 4,468,293 | 8/1984 | Polan et al. | 204/27 |
| 4,495,008 | 1/1985 | Bruno et al. | 428/658 |
| 4,515,671 | 5/1985 | Polan et al. | 204/228 |
| 4,572,768 | 2/1986 | Wolski et al. | 428/658 |
| 4,640,747 | 2/1987 | Ueno et al. | 204/37.1 |
| 4,647,315 | 3/1987 | Parthasarathi et al. | 148/258 |
| 4,702,802 | 10/1987 | Umino et al. | 204/44.2 |

FOREIGN PATENT DOCUMENTS

| | | |
|---|---|---|
| 328208 | 3/1972 | U.S.S.R. |
| 2073779A | 10/1981 | United Kingdom |
| 2030176A | 4/1989 | United Kingdom |

Primary Examiner—John Zimmerman
Attorney, Agent, or Firm—Gregory S. Rosenblatt; Paul Weinstein

[57] ABSTRACT

A technique for improving the tarnish and oxidation resistance of copper and copper based alloy materials is disclosed. Copper or a copper alloy is immersed in an aqueous solution containing sodium hydroxide, zinc ions and chromium (VI) ions. While the compositional ranges may vary, the concentration of either zinc ions or chromium (VI) ions, or both, is less than 1.0 gm/l. A chromium-zinc coating is electrolytically applied. The coating provides tarnish resistance at temperatures in excess of 190° C. The coating is removable by immersion in sulfuric acid. Improved results are obtained by rinsing deionized water containing a small amount of an alkaline or alkaline earth hydroxide.

14 Claims, 1 Drawing Sheet

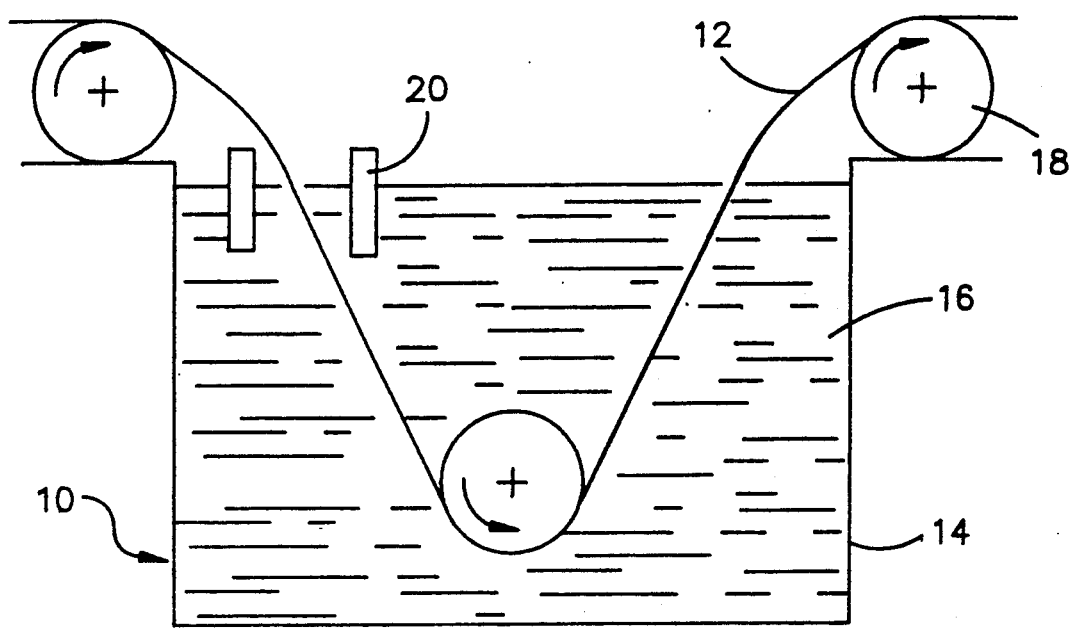

CHROMIUM-ZINC ANTI-TARNISH COATING ON COPPER FOIL

This application is a division of U.S. patent application Ser. No. 07/585,832, filed Sept. 20, 1990, now U.S. Pat. No. 5,022,968, which in turn is a continuation in part of U.S. patent application Ser. No. 07/459,846 filed Jan. 2, 1990 (now abandoned) which is a continuation in part of U.S. patent application Ser. No. 07/421,475 filed on Oct. 13, 1989 (now abandoned).

BACKGROUND OF THE INVENTION

The present invention broadly relates to a method for treating copper and copper base alloy materials to form a tarnish and oxidation resistant film. More particularly, the invention relates to an electrolyte and an electrolytic means for depositing a chromium-zinc film on a copper or copper base alloy foil.

Copper and copper base alloy foils are widely used in the printed circuit board industry. The foil is produced to a thickness of under 0.006 inches and more generally to a thickness in the range of from about 0.0002 inches (known in the art as ⅛ ounce foil) to about 0.0028 inches (known in the art as 2 oz. copper foil). The foil is produced by one of two means. "Wrought" foil is produced by mechanically reducing the thickness of a copper or copper alloy strip by a process such as rolling. "Electrodeposited" foil is produced by electrolytically depositing copper ions on a rotating cathode drum and then peeling the deposited strip from the cathode.

The foil is then bonded to a dielectric support layer forming a printed circuit board. The dielectric support layer is typically a polyimide such as Kapton manufactured by DuPont or FR-4 (a fire retardent epoxy). The copper foil layer is laminated to the dielectric carrier layer. Lamination comprises bonding the copper foil layer to the dielectric carrier layer through the use of heat and pressure. A pressure of about 300 psi, at a temperature at about 175° C. for a time of up to 30 minutes will provide suitable adhesion between the layers.

To maximize adhesion, it is desirable to roughen the surface of the foil which contacts the dielectric prior to bonding. While there are a variety of techniques available to roughen or treat the foil, one exemplary technique involves the formation of a plurality of copper or copper oxide dendrites on the foil surface. U.S. Pat. Nos. 4,468,293 and 4,515,671, both to Polan et al disclose this treatment. The process produces COPPERBOND ® foil (COPPERBOND ® is a trademark of Olin Corporation, Stamford, Connecticut).

One problem facing printed circuit board manufacturers using either electrolytic or wrought copper foils is the relative reactivity of the copper. Copper readily stains and tarnishes. Tarnishing may occur during room temperature storage of the foil or during elevated temperature lamination. The stains and tarnish are aesthetically unpleasant and may be a source of problems during the manufacture of the printed circuit board. For example, staining of copper foil prior to lamination can affect both the bond strength between the foil and the dielectric substrate and the etching characteristics of the resultant laminate.

In the past, stain resistance has been imparted to copper and copper base alloy materials by immersion in an electrolyte containing chromate ions. U.S. Pat. No. 3,625,844 to McKean, describes a method of stain-proofing copper foil involving the electrolytic treatment of the foil in a aqueous electrolyte under critical conditions of hexavalent chromium ion concentration, cathode current density, and treatment time.

U.S. Pat. No. 3,853,716 to Yates et al, discusses the McKean process and points out that it is not a completely satisfactory stain-proofing technique, due to a build-up of copper and chromium cations in the electrolyte bath. The cations interfere with the effectiveness of the stain proofing. Yates et al attempt to overcome this problem by rendering the copper material cathodic as it passes through an aqueous electrolyte containing hexavalent chromium ion containing anions and being of sufficient alkalinity to cause precipitation of copper and chromium cations.

U.S. Pat. No. 4,387,006 to Kajiwara et al, discloses coating a copper foil with zinc chromate to prevent a reaction between the hardener added to an epoxy-glass substrate and the foil. The coating is deposited from an aqueous solution containing in excess of 1.0 g/l of both zinc and chromium (VI) ions.

Still other stain proofing techniques are illustrated in United Kingdom Published Patent applications 2,030,176A and 2,073,779A and U.S. Pat. No. 4,131,517 to Mutsuo et al.

Solutions of phosphoric acid, chromic acid and/or their salts have also been applied to various materials in an attempt to impart tarnish and corrosion resistance. U.S. Pat. Nos. 3,677,828, 3,716,427 and 3,764,400, all to Caule, illustrate the use of phosphoric acid solutions to improve the tarnish resistance of copper and copper-based alloys. Caule also describes in his '400 patent the use of a caustic rinse solution after application of his phosphoric acid treatment. U.S. Pat. No. 4,647,315 to Parthasarathi et al discloses a dilute aqueous chromic acid-phosphoric acid solution.

Phosphoric and/or chromic acid solutions have also been applied to zinc, zinc-coated articles and aluminum foil and articles. U.S. Pat. Nos. 2,030,601 to McDonald, 2,412,532 to Tanner, 2,418,608 to Thompson et al, 2,647,865 to Freud and 4,432,846 to Honnycutt, III illustrate some of the applications of phosphoric-chromic acid solution.

Following lamination, the anti-tarnish coating must be removed so the underlying copper foil may be etched into a desired circuit pattern. Circuit traces are patterned into the copper foil by photolithography as known in the art. The unbonded side of the copper foil is coated with a photo-sensitive chemical resist. The resist is exposed to a developer such as ultraviolet light exposed through a mask containing the desired circuit pattern. Dependent on whether the photoresist is that known in the art as "positive" resist or "negative" resist, the image may be either a desired circuit pattern, or the negative image. After exposure, the unexposed portion of the photoresist is removed by rinsing with an appropriate solvent to expose the underlying foil. The circuit board is then immersed in a suitable etchant to remove the exposed copper. After etching and rinsing, the remaining photoresist is removed by a solvent wash. The dielectric substrate is unaffected by the solvent and etchant. The substrate remains intact and the copper foil layer is patterned into a desired configuration of circuit traces.

If the anti-tarnish coating layer is not completely removed, it may interfere with the etching step during photolithography resulting in incomplete etching and the potential for an electrical short circuit. One chemical solution used to remove the anti-tarnish coating comprises 4% by volume, hydrochloric acid in water. Many of the prior art anti-tarnish coatings are not readily removed by the 4% HCl solution and require mechanical abrasion or other invasive techniques. Partial removal of the coating layer or an inordinately long process time may result.

While generally used as the etchant to remove the anti-tarnish coating from copper foil, hydrochloric acid is not desirable for environmental reasons. The chloride ions present are environmentally damaging. Regeneration of the ions into a reusable etchant or the safe disposal of the ions is an expensive proposition. A preferred solution would be to provide an anti-tarnish coating which is readily removed by a less harmful etchant.

It is known in the art that a chromium-zinc compound forms a satisfactory anti-tarnish coating for copper and copper base alloys. One such commercial coating has the composition 10 atomic % Zn; 5% Cr; 37% O; 46% C and 2% Cu. The coating is readily removed with a 4% HCl solution. However, the coating is not removable by other, more preferred etchants such as $H_2SO_4$.

SUMMARY OF THE INVENTION

Accordingly, it is an object of the present invention to provide an electrolytic solution capable of depositing a chromium-zinc compound on the surface of a copper or copper alloy foil. It is a further object of the invention to provide a method for electrolytic deposition such that a high through-put rate and controlled compound composition may be achieved. It is an advantage of the present invention that the coating layer so deposited has good tarnish-resistance to both roughened foil surfaces as well as smooth foil surfaces. It is a further advantage of the invention that the coating layer is readily removed by a 4% HCl solution. Yet another advantage of the invention is the coating layer so produced is readily removed in a dilute sulfuric acid solution. It is a feature of the invention that in one embodiment a caustic rinse solution is provided which further improves the tarnish resistance of the coating when applied to a roughen surface.

In accordance with the present invention, there is a provided an aqueous basic electrolytic solution containing hydroxide ions, from about 0.07 to about 7 grams per liter of zinc ions, and from about 0.1 to about 100 grams per liter of a water soluble hexavalent chromium compound. Provided, however, that at least one of the zinc ion or chromium (VI) ion concentration is less than 1.0 gm/l. The operating temperature may be from room temperature to about 100° C.

The invention further provides a method for the deposition of a removable anti-tarnish coating from the aqueous electrolyte solution. A copper or copper base alloy foil is immersed in the solution. A current density of from about 1 milliamp per square centimeter to about 1 amp per square centimeter is applied with the foil serving as the cathode. The foil remains in the electrolyte for a time sufficient to deposit a chromium-zinc coating layer having a thickness effective to prevent tarnish. The strip is then rinsed and dried.

The objects, features and advantages discussed above will become more apparent from the specification and drawing which follow.

BRIEF DESCRIPTION OF THE DRAWING

The FIGURE illustrates an electrolytic cell for depositing a chromium-zinc anti-tarnish coating according to the method of the invention.

DETAILED DESCRIPTION OF THE INVENTION

The FIGURE illustrates an electrolytic cell 10 for depositing an anti-tarnish coating on the surface of the copper or copper base alloy foil 12 according to the method of the invention. The electrolytic cell 10 comprises a tank 14 which may be manufactured from any material which does not react with the electrolytic solution 16. An exemplary material for tank 14 is a polymer, such as polyethylene or polypropylene.

Guide rolls 18 control the travel of the foil strip 12 through the electrolytic cell 10. The guide rolls 18 are manufactured from any material which does not react with the electrolyte solution 16. Preferably, at least one of the guide rolls is formed from an electrically conductive material, such as stainless steel, so that a current may be impressed in the copper foil strip as detailed hereinbelow. Guide rolls 18 rotate at a controlled speed so that the foil strip 12 is positioned between anodes 20 for a required time as discussed hereinbelow.

The power source (not shown) is provided so that an electric current may pass from the anodes 20 to the foil strip (cathode) 12 by means of the electrolytic solution 16. In this way, an anti-tarnish coating with the desired composition and thickness is deposited on the foil strip 12.

The electrolytic solution of the invention consists essentially of a hydroxide source, zinc ion source and a water soluble hexavalent chromium. The hydroxide source is preferably sodium hydroxide or potassium hydroxide, and most preferably, sodium hydroxide (NaOH). The hexavalent chromium source may be any water soluble hexavalent chromium compound such as $Na_2Cr_2O_7.2H_2O$.

In its broadest compositional range, the electrolyte solution 16 consists essentially of from about 5 to about 100 grams per liter of the hydroxide, from 0.07 up to about 7 grams per liter of zinc ions supplied in the form of a water soluble zinc compound such as ZnO and from 0.01 to about 100 grams per liter of a water soluble hexavalent chromium salt. Provided, however, that at least one of the zinc ion or chromium (VI) ion concentrations is less than 1.0 gm/l. In a preferred embodiment, the electrolyte contains from about 10 to about 25 grams per liter NaOH, from about 0.16 to about 1.2 gm/l zinc ions, most preferably be in the form of 0.2 to about 1.5 grams per liter ZnO and from about 0.08 to about 0.78 gm/l Cr(VI) ions most preferably be in the form of from about 0.2 to about 2 grams per liter sodium dichromate.

With each of the solutions described herein above, it is believed that an effective concentration of a surfactant such as lauryl sulfate will provide a more uniform surface.

The pH of the solution is maintained as basic. A pH in the range of from about 12 to 14 is preferred. The solution readily operates at all temperatures from room temperature up to about 100° C. For maximum deposition rates, it is preferred to maintain the electrolyte temperature in the range of about 35° C. to about 65° C.

The electrolyte solution operates well in a wide range of current densities. Successful coatings may be applied with a current density ranging from 1 milliamp per square centimeter up to about 1 amp per square centimeter. A more preferred current density is from about 3 mA/cm² to about 100 mA/cm². The actual current density employed is dependent on the time the foil strip 12 is exposed to the current. That is, the time the foil strip 12 is between the anodes 20 and immersed in electrolyte solution 16 typically, this dwell time is from about 10 to about 25 seconds. During this dwell, an effective thickness of the anti-tarnish coating compound 10 is deposited. The effective thickness is that capable of inhibiting copper tarnish at elevated temperatures of up to about 190° C. in air for about 30 minutes. The anti-tarnish coating should further be sufficiently thin to be easily removable with a 4% HCl etch solution or preferably a 5 wt % $H_2SO_4$ etch solution. It is believed that an effective coating thickness is from less than 100 angstroms to about 0.1 microns. Successful results have been obtained with coating thicknesses as low as 40 angstrom and coating thicknesses of from about 10 angstroms to about 100 angstroms are preferred. The coating layer is sufficiently thin to appear transparent or impart a slight gray tinge to the copper foil.

The coated foil strip 12 exits the electrolytic cell 10 and excess electrolyte is rinsed from the surfaces of the strip. The rinse solution may comprise deionized water. More preferably, a small quantity of a caustic is added to the deionized water rinse solution. The concentration of caustic is quite low, under 1 percent. Preferably the caustic concentration is from about 50 to about 150 parts per million. The caustic is selected to be the hydroxide of an alkali metal or the hydroxide of an alkaline earth metal selected from the group consisting of sodium hydroxide, calcium hydroxide, potassium hydroxide and ammonium hydroxide. Most preferred is calcium hydroxide.

A small amount of an organic silane, such as $C_8H_{22}N_2O_3Si$, on the order of about 1 milliliter per liter may also be added to the rinse solution to maintain peel strength.

After rinsing, the foil strip is dried by forced air. The air may be cool, that is at room temperature or heated. Heated forced air is preferred since accelerated drying minimizes spotting of the foil.

The improvements achieved with anti-tarnish coatings applied by the method of the present invention will be more clearly understood by the examples which follow.

EXAMPLE A

A copper foil produced by electrodeposition was given an anti-tarnish coating according to the method of the present invention. The foil had a smooth surface corresponding to the side of the foil which was in contact with the cathode during electroposition and a rough surface corresponding to the opposite side of the foil.

The foil was coated with a chromium-zinc anti-tarnish coating by immersion in an electrolyte solution containing 100 grams per liter NaOH, 8.5 grams per liter ZnO, and 75 grams per liter $Na_2Cr_2O_7.2H_2O$. A current density of 5 mA/cm² was impressed on the foil. Dwell time within the anodes was 15 seconds. After coating, the foil was rinsed in distilled water for 15 seconds and dried with forced air.

The coated foil was tested for tarnish resistance. A simulated printed circuit board lamination thermal cycle was employed. The simulation comprised a 30 minute air bake at 190° C. Throughout the examples, the expression "simulated lamination" or equivalent refers to a thermal cycle comprising a 30 minute air bake at 190° C. No discoloration was observed on the shiny side of the foil after the simulation. Extensive discoloration was noted on the rough side of the foil.

The anti-tarnish film was easily removed from both sides of the copper foil with 4% HCl. Total removal of the anti-tarnish film was verified by exposing the foil to $(NH_4)_2S$ fumes. The foil turned blue indicating interaction between the fumes and copper.

EXAMPLE B

A second strip of electrodeposited copper foil was given an anti-tarnish coating according to the method of the invention. The electrolyte contained 20 grams per liter NaOH, 1.7 grams per liter ZnO, and 15 grams per liter $Na_2Cr_2O_7.2H_2O$. After coating, the foil was rinsed in distilled water followed by a rinse in distilled water containing 100 parts per million of $Ca(OH)_2$. The shiny side of the foil exhibited no discoloration following simulated lamination. The anti-tarnish coating was completely removed with immersion in a 4 percent HCl solution.

The roughened side of the electrodeposited foil was not evaluated.

EXAMPLE C

An electrodeposited copper foil strip was given an anti-tarnish coating according to the method of the invention. The electrolyte solution contained 20 grams per liter NaOH, 0.85 grams per liter ZnO, and 1.5 grams per liter $Na_2Cr_2O_7.2H_2O$. Following electrolytic deposition, the strip was rinsed in distilled water followed by a rinse in distilled water containing 100 ppm $Ca(OH)_2$ and 1 milliliter per liter silane. After drying the anti-tarnish coating on the shiny side of the strip was evaluated. No discoloration was detected during simulated lamination and the coating was rapidly removed with 4% HCl. The roughened side of the strip was not evaluated.

EXAMPLE D

A wrought copper foil having one side roughened with dendriditic copper by the COPPERBOND® process was given an anti-tarnish coating according the method of the invention. The electrolyte solution contained 20 grams per liter NaOH, 1 gram per liter ZnO, and 1 gram per liter $Na_2Cr_2O_7.2H_2O$. The solution temperature was varied between room temperature and 65° C. Following application of the coating, the foil was rinsed in distilled water containing 100 ppm of $Ca(OH)_2$ heated to a temperature of about 70° C. for 25 seconds and then dried by forced air. Various current densities were applied during deposition.

After drying, the coated strip was evaluated for discoloration and ease of removal of the coating as detailed above. At a total electrical charge of about 50 mC/cm² (mC stands for millicoulomb and represents mA×seconds (5 mA/cm²×10 seconds=50 mC/cm²)), the shiny surface of the wrought foil met all requirements. At a total charge of 70 mC/cm² (7 mA/cm²×10 seconds), the roughened surface of the wrought foil also passed the evaluation tests.

EXAMPLE E

Wrought foil with one side roughened as in Example D was coated in solutions containing 20 grams per liter NaOH, 1 gram per liter ZnO, and either 3 grams or 10 grams per liter $Na_2Cr_2O_7 \cdot 2H_2O$. Good tarnish resistance as determined by the simulated lamination cycle was achieved on the shiny surface. However, the roughened surface showed marginal tarnish resistance with the coating from the solution containing 3 grams per liter dichromate and no tarnish resistance when coated in the solution containing 10 grams per liter dichromate. As the chromium (VI) ion concentration was increased from 0.39 gm/l (Example D) to 1.18 gm/l (Example E) to 3.9 gm/l (Example E), the anti-tarnish resistance steadily decreased. As discussed above, at least one of the zinc ion or chromium (VI) ion concentration is maintained below 1.0 gm/l.

EXAMPLE F

Wrought foil having a shiny side and a roughened side as above was coated according to the method of the invention using the solution of Example D. The post plating rinse contained only distilled water. The caustic additive was eliminated. Following the simulated lamination cycle, the shiny surface of the foil had no discoloration, however, the roughened surface was tarnished.

EXAMPLE G

Wrought foil having a shiny side and a roughened side was coated according to the method of the invention using the solution of Example D. The amperage impressed on the anode 20 facing the shiny side of the foil was 36 amps while the anode facing the roughened side of the foil was 54 amps. The plating time was about 12 seconds.

The coating so produced was readily and rapidly removed in a 5 wt % $H_2SO_4$ solution. That is an advantage over the commercially available Cr/Zn coating described above which is not removable in a 5 wt % $H_2SO_4$ etchant.

The composition of the coating layer was determined by Electron Spectroscopy for Chemical Analysis (ESCA) and the shiny side composition was determined to be 5 atomic % Cr; 21% Zn; 56% O; 16% C and 1% Cu. A difference between the coating layer produced by the method of the invention and the commercially available Cr/Zn coating is the ratio of zinc to chromium. While the commercially available coating has a 2:1 ratio, the method of the invention produced a ratio in excess of 4:1 for the conditions of Example G.

The thickness of the coating layer was next determined by Auger Electron Spectroscopy. The technique employs an X-Ray source to sputter away the surface of the sample at a controlled rate, for example, 10 angstroms per minute. The composition of the vaporized material is analyzed. A 50% copper level was considered to indicate the substrate had been reached. The thickness of the coating layer of the invention was determined to be about 40 angstroms as compared to about 80 angstoms for the commercially available material. The satisfactory properties of the anti-tarnish coating of the invention at 40 angstroms indicates a coating thickness in the range of about 10 angstroms to about 100 angstroms would be sufficient.

Both the commercially available material and the foil coated according to Example G were subjected to the simulated lamination. Higher bake tests at 210° C. and 230° C. both for 30 minutes in air were also evaluated. As illustrated in Table 1, the coating layer produced by the process of the invention is clearly superior to the commercially available material.

TABLE 1

| Bake Test | Results | |
|---|---|---|
| | Invention Rough/Shiny Side | Commercial Rough/Shiny Side |
| 190° | pass/pass | fail/pass |
| 210° | pass/pass | fail/pass |
| 230° | pass/fail | fail/fail |

From the examples above, it may be seen that an anti-tarnish coating may be applied to a copper or copper based alloy strip by electrolytic deposition. Smooth and shiny surfaces are easily coated. Electrolytic solutions containing a caustic component, zinc oxide and a hexavalent chromium salt within a specified range of compositions are acceptable. Rinsing may be in either distilled water or distilled water containing a caustic additive.

Effective solutions to electrolytically deposit an anti-tarnish coating on a roughened copper or copper base alloy surface are more limited in composition. The chromium (VI) ion concentration should be maintained below about 1.5 grams per liter. Preferably, the chromium (VI) concentration should not exceed about 1.0 grams per liter. Following deposition of the anti-tarnish coating, the coated strip is preferably rinsed in a solution of distilled water containing a small concentration of a caustic.

As discussed above, the addition of an organic additive such as lauryl sulfate to the electrolyte is believed to improve the properties of the anti-tarnish coating. At 30 ppm lauryl sulfate, the oxidation resistance of the coating was found to extend to about 10° higher than a coating deposited from the same electrolyte without the additive. Other properties such as peel strength and acid removability were not affected. The effective composition of the surfactant is believed to be from about 10 ppm to about 50 ppm.

While not fully understood, the co-electrodeposited anti-tarnish layer is believed to be either an alloy of chromium and zinc or a partial hydroxide compound of those elements or mixtures of such alloys and compounds. It is also believed that the coating includes a higher weight percentage of zinc as compared to chromium.

The patents cited in this application are intended to be incorporated by reference.

It is apparent that there has been provided in accordance with this invention electrolytic solutions for depositing a chromium-zinc anti-tarnish coating on copper or a copper based alloy foil as well as a means for the deposition of such a coating which fully satisfy the objects, means, and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. A copper or copper based alloy material having a coating layer to improve resistance to tarnishing at elevated temperatures wherein said coating layer comprises a co-deposited layer including zinc and chromium with a zinc-to-chromium ratio in excess of about 4:1.

2. A copper or copper based alloy material as in claim 1 wherein said coating layer is co-electrodeposited.

3. A copper or copper based alloy material as in claim 1 wherein said copper or copper based alloy material comprises a foil strip.

4. A copper or copper based alloy material as in claim 2 wherein said copper or copper based alloy material comprises a foil strip.

5. The copper or copper based alloy material of claim 3 wherein the thickness of said coating layer is effective to inhibit copper tarnish at temperatures of up to about 190° C.

6. The copper or copper based alloy material of claim 5 wherein the thickness of said coating layer is from about 10 angstroms to about 0.1 microns.

7. The copper or copper based alloy material of claim 6 wherein the thickness of said coating layer is from about 10 angstroms to about 100 angstroms.

8. The copper or copper based alloy material of claim 6 wherein said foil strip has at least one side roughened with dendritic copper.

9. The copper or copper based alloy material of claim 8 wherein said coating layer contains at least 20 atomic percent zinc.

10. The copper or copper based alloy material of claim 6 wherein said coating layer contains at least 20 atomic percent zinc.

11. The coated copper or copper based alloy material of claim 8 wherein said coating layer is deposited from a basic solution having hydroxide ions, from about 0.07 grams per liter to about 7 grams per liter zinc ions supplied in the form of a water soluble zinc compound and from about 0.1 grams per liter to about 100 grams per liter of chromium (VI) ions in the form of a water soluble hexavalent chromium salt wherein the concentration of either said ions or said chromium (VI) ions or both is less than 1.0.

12. The copper or copper based alloy material of claim 11 wherein said solution further includes lauryl sulfate in a concentration of from about 10 ppm to about 50 ppm.

13. The copper or copper based alloy material of claim 1 wherein said coating layer is deposited from a basic solution having hydroxide ions, from about 0.007 grams per liter to about 7 grams per liter zinc ions supplied in the form of a water soluble zinc compound and from about 0.1 grams per liter to about 100 grams per liter of chromium (VI) ions in the form of a water soluble hexavalent chromium salt wherein the concentration of either said zinc ions or said chromium (VI) ions or both, is less than 1.0.

14. The copper or copper based alloy material of claim 13 wherein said solution further contains lauryl sulfate in a concentration of from about 10 ppm to about 50 ppm.

* * * * *